(12) United States Patent
Tonti et al.

(10) Patent No.: US 6,362,056 B1
(45) Date of Patent: Mar. 26, 2002

(54) METHOD OF MAKING ALTERNATIVE TO DUAL GATE OXIDE FOR MOSFETS

(75) Inventors: William R. Tonti, Essex Junction, VT (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,567

(22) Filed: Feb. 23, 2000

(51) Int. Cl.[7] .......................................... H01L 21/8234
(52) U.S. Cl. ....................... 438/275; 438/289; 438/527; 438/546
(58) Field of Search .................. 438/275, 289, 438/290, 291, 527, 546, 232, 592

(56) References Cited

U.S. PATENT DOCUMENTS

| | | |
|---|---|---|
| 3,895,966 A | 7/1975 | MacDougall |
| 4,315,781 A * | 2/1982 | Henderson .................. 148/187 |
| 4,472,871 A | 9/1984 | Green |
| 4,555,842 A | 12/1985 | Levinstein |
| 4,714,519 A | 12/1987 | Pfiester |
| 4,782,033 A | 11/1988 | Gierisch |
| 5,010,032 A | 4/1991 | Tang |
| 5,218,221 A | 6/1993 | Okumura |
| 5,468,666 A | 11/1995 | Chapman |
| 5,637,903 A * | 6/1997 | Liao et al. .................. 438/217 |
| 5,770,494 A | 6/1998 | Yamamoto |
| 5,786,619 A | 7/1998 | Kinzer |
| 5,834,352 A | 11/1998 | Choi |
| 5,837,573 A | 11/1998 | Guo |

* cited by examiner

Primary Examiner—Chandra Chaudhari
Assistant Examiner—Yennhu B. Huynh
(74) Attorney, Agent, or Firm—Rosenman & Colin, LLP.

(57) ABSTRACT

A method for forming depleted conductor regions in MOSFET arrays includes the steps of preparing a substrate, forming a conductor layer on the substrate, implanting a dopant species into the conductor layer, masking portions of the doped conductor layer, and counterdoping unmasked portions of the doped conductor layer to form said depleted conductor regions on the substrate. This method provides an alternative to dual gate oxide for MOSFETS wherein low voltage regions at doped layers are used for support devices and high voltage regions at counterdoped portions are used for memory arrays such as DRAM, EDRAM, SRAM and NVRAM. This method is also applicable for all chips requiring high and low voltage integral device operation.

38 Claims, 2 Drawing Sheets

Figure 1: Vth Versus Leff for thin and Thick Oxide
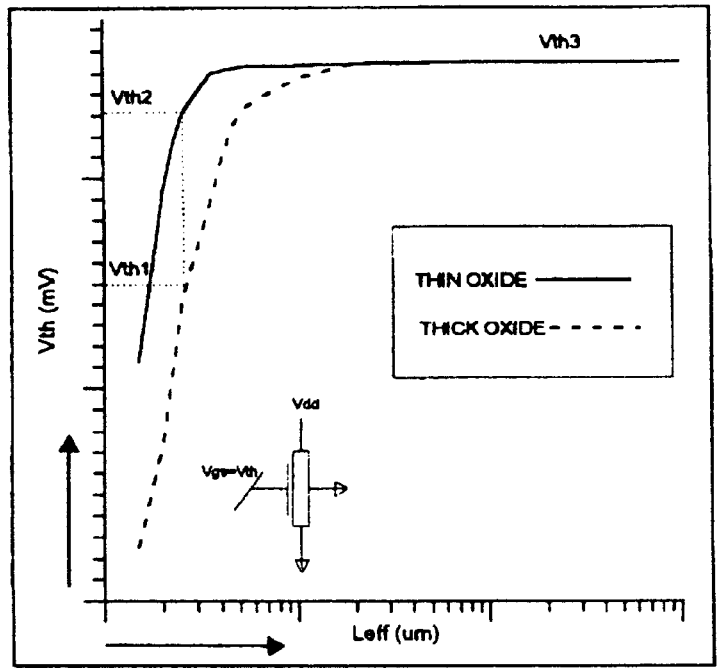
Figure 2: Output current characteristic of thin and thick oxide devices
For Vdd=constant, Vbb=constant, and Vgs swept.
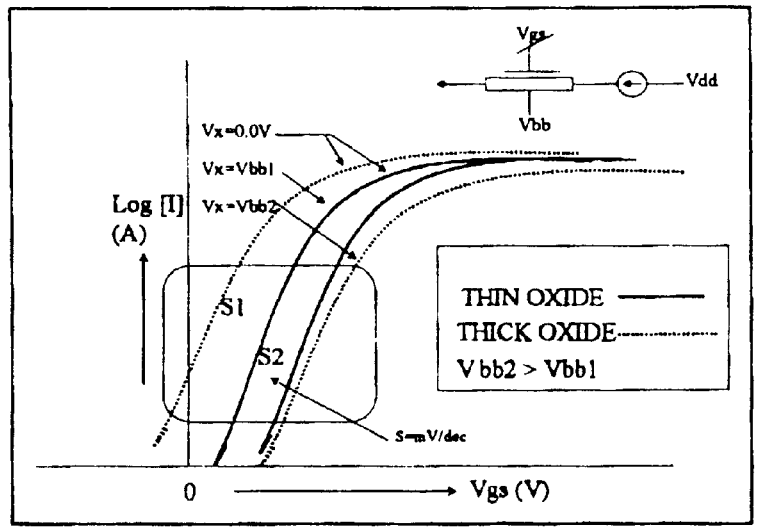

Figure 3: WB mask used to separate Array and Non-Array GC
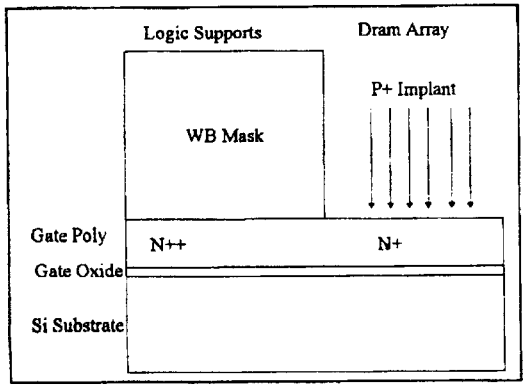
Figure 4: Standard GC Process follows Implant.
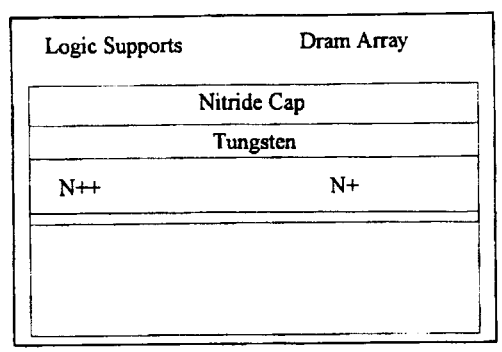
Figure 5: WB mask used to separate Array and Non-Array GC
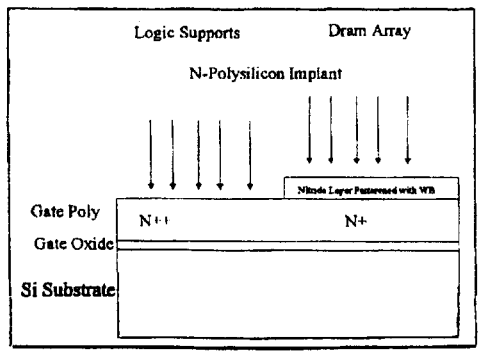
Figure 6: Standard GC Process follows Implant.
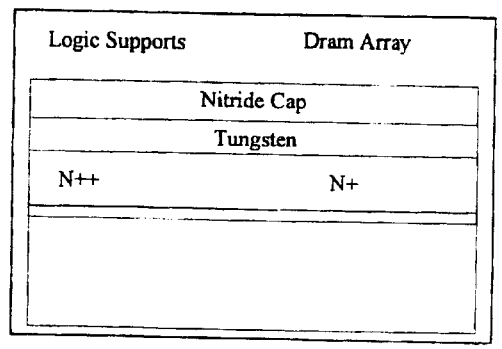

METHOD OF MAKING ALTERNATIVE TO DUAL GATE OXIDE FOR MOSFETS

FIELD OF INVENTION

The present invention relates to a method of making an alternative to dual gate oxide for high voltage operation and more particularly to a method of forming depleted conductor regions on a substrate for memory devices. This method is also applicable to memory technologies employing an insulating cap over gate conductor for forming border-less contact.

BACKGROUND OF THE INVENTION

Various techniques have been employed for forming high and low voltage devices on the same substrate. For example, U.S. Pat. No. 5,834,352 is directed to a method for making integrated circuits containing high and low voltage insulated-gate field effect transistors on the same substrate using different gate oxide thickness.

For forming depletion devices by doping a depletion layer into the channel region below the gate, U.S. Pat. No. 5,786,619 discloses a method of making depletion mode power metal oxide semiconductor field effect transistors (MOSFET) having a refractory gate electrode, wherein the base regions are formed by introducing into the layer dopant of one conductivity type. In particular, U.S. Pat. No. 4,472,871 describes a method of making a plurality of MOSFETs having different threshold voltages by the repeated steps of masking and implanting various ion implantation doses in channels.

In U.S. Pat. Nos. 5,770,494 and 4,782,033, there are disclosed processes for doping gates of metal oxide semiconductor devices through diffusion from a refractory layer. Further, U.S. Pat. No. 5,218,221 discloses threshold voltage adjustment by implanting into the channel region impurity ions at a tilt angle with a semiconductor substrate rotated, using the transfer gate electrode as a mask. CMOS devices in which the gates of the NMOS devices are doped n-type and the gates of the PMOS devices are doped p-type are disclosed in U.S. Pat. Nos. 5,010,032 and 4,555,842.

The conventional method comprises the step of doping polysilicon gates of both types of devices in which the doping level of the high voltage devices is less than that of the low to voltage devices such that the high voltage depletes the channel. For example, U.S. Pat. No. 5,637,903 is directed to a process for fabricating metal oxide semiconductor field effect transistors using one gate oxide thickness and resulting in both low and high operating voltage devices. The fabrication sequence has been developed to form an undoped or partially doped structure for high voltages and a doped structure for low voltages.

Further, U.S. Pat. No. 5,468,666 describes using a change in doping of polygate to permit placing both high and low voltage transistors on the same chip. High voltage transistor comprises a polysilicon gate doped at a low dopant level and low voltage transistor comprises a polysilicon gate doped at a high dopant level.

However, none of the conventional techniques describe a method of making an alternative to dual gate oxide for word line operation by forming doped and depleted conductor regions on a substrate, in which the doped low voltage devices are used for support devices and the depleted high voltage devices are used for word line devices.

In DRAM Technology CMOS support circuitry logic voltages do not scale with the array word line boost voltage requirements. In order to write the DRAM cell capacitor in a reasonable amount of time, a typical voltage level equal to Vdd+1 volt is applied to the word line, i.e., gate electrode of the transfer device, to increase the current drive of the transistor. When the DRAM transistor is in an off condition i.e., the gate is typically grounded, the requirement of the transfer device changes from writing to the cell to having it remain charged and not leak through the transfer device for as long a time as possible. In this case, the back gate voltage or body bias is typically set to a value between −0.5 volts and −1.0 volts, which inhibits cell leakage. Unfortunately this voltage level is also present during the write described above. This has the natural tendency of slowing the device down.

The conditions described above diametrically oppose each other with respect to the electric fields and device design. For example, in a typical 2.1 volt technology, e.g., 256 mB synchronous DRAM with 0.15 um lithography, the dielectric thickness (Tox) in the transistor support region is scaled to 4.5 nm. With this value of Tox, the maximum gate to drain field [Vg−Vd]/Tox is approximately 4.7MV/cm, the device design has a nominal logic support threshold voltage (Vt) of approximately 0.5 volts and thus the overdrive voltage equal to 1.6 volts (Vg−Vt). However, the DRAM transistor has a nominal threshold voltage of approximately 1.07 volts with the body voltage equal to −1 volts, and the oxide thickness equal to 6.2 nm, thus having an overdrive of 1.03 volts, if no wordline boost is employed.

Since current drive is roughly proportional to the overdrive squared, it becomes obvious under identical conditions that the drive of the DRAM device is 41% of the logic drive. In reality the situation is degraded further by the change in gate oxide thickness and other unique DRAM features that are not pertinent to this discussion. To overcome this deficiency, the DRAM array is compensated by increasing the word line voltage to Vdd +1V. This example results in an overdrive voltage equal to 2.03 volts, and a maximum gate to drain field of approximately 5MV/cm, which is typically the highest use field allowed.

The DRAM dual oxide process, i.e., logic support device/ array transfer device are used for the first time in this 256 MB generation. Listed below in Table 1 is a cross section of recent DRAM power supply and field configurations. As can be observed, the system power supply (Vdd) does not scale directly with the oxide thickness, as is also the case with threshold voltage, and thus arises the need for reducing the field in the DRAM array. Unfortunately thickening the gate oxide is in a direct conflict with device scaling. For example the short channel effect, otherwise known as drain induced barrier lowering is adversely affected by thickening the gate oxide. This affect is electrically manifested as a reduction in threshold voltage for thick oxide as compared to thin oxide for otherwise equivalent device designs (i.e. same gate length and Vdd). This is shown in FIG. 1, where the thin and thick oxide devices are designed for the same long channel threshold voltage (Vth3), but the thin oxide device has a larger threshold voltage (Vth2) than does the thick oxide (Vth1) at the lithographically designed channel length (Leff). This drop in short channel Vt for the thick oxide device is due to enhanced drain-induced barrier lowering (DIBL). The threshold voltage measurement is shown for source to substrate potential at ground, and the drain at Vdd.

TABLE 1

DRAM Generation/Power Supply

| Product Type | Vdd | Tox Logic - Max E field | Tox Array/ Max E Field |
|---|---|---|---|
| 64M EDO | 2.8 Volts | 8.0 nm - 3.5 MV/cm | 8.0 nm - 4.9 MV/cm |
| 64M Synch | 2.5 Volts | 7.5 nm - 3.3 MV/cm | 7.5 nm - 4.7 MV/cm |
| 256M Synch | 2.1 Volts | 4.5 nm - 4.7 MV/cm | 6.2 nm - 5.0 MV/cm |

The thick gate oxide in the array also degrades the sub-threshold slope, S, increasing adversely the off current in the device, which places an additional demand on the level of body bias required to suppress off-state leakage. The increased body bias adversely affects junction leakage, and places an upper bound on the usable body voltage range.

This is illustrated in FIG. 2 where the gate voltage is swept for a constant drain and substrate voltage. Comparing the thin (solid line) to thick (dashed line) output characteristics, the sub-threshold slope S2 (thick) is greater than S1 (thin), thus the leakage current at Vgs=0 is greater for the thick device. In order to suppress the thick oxide leakage the magnitude of the body bias (Vbb) is greater for the thick oxide versus the thin oxide. (i.e., Vbb2>Vbb1). In reality higher Vbb may limit the useful Vbb voltage as united by the junction leakage of FIG. 2.

Assuming a safe operational field of 5MV/cm, DRAM technology continues to have a problem with array and logic operation necessitating some form of gate oxide field reduction in the array. As devices scale lithographically, this becomes much more difficult in controlling the slope and short channel effect for minimum sized cell designs. Thus, an alternative technique is sought which preserves the design scaling and also allows for a gate voltage in the array and possibly other areas to safely exceed Vdd in use condition.

Therefore, the present invention provides a solution where the array gate electrode doping level is altered to provide adequate gate depletion under boosted (Vgate>Vdd) conditions, allowing the use of a support gate oxide everywhere. This also has the benefit in improving the sub-threshold slope in the off-state, and reducing the body bias voltage level to achieve a required minimum off current criterion.

SUMMARY OF THE INVENTION

It is therefore an object of the present invention to provide a method for forming depleted conductor regions on a substrate for memory operation or more generally for mixed voltage level operation. A typical example is a mobile processor designed for low voltage internal operation (hence lower power), but the I/O circuitry must be able to interface and handle higher voltages.

Another object of the present invention is to make both types of devices by forming a doped conductor layer and counter doping of the doped conductor layer. According to the present invention, the doped regions constitute low voltage devices, while the counterdoped portions constitute high voltage devices. It is a further object of the present invention to provide an alternative to dual gate oxide for MOSFETS, in which the high voltage devices are used for memory and logic devices, including word line drives, array access transistors, and I/O drives, while the low voltage devices are used for internal support devices. Preferably, word line devices in accordance with the present invention are used in the area of technology utilizing memory arrays, e.g., DRAM, EDRAM, SRAM and NVRAM and I/O devices are used in either memory, micro processors, DSP's, mobile phones and ASIC's.

The present invention describes memory applications which maintain good characteristics, while allowing thicker oxide for boost and can be extended to the applications mentioned. The present invention therefore has the advantage of allowing both conventional low voltage MOSFETS and high voltage operation of a modified low voltage MOSFET.

These and other objects of the present invention, which shall become herein apparent, are achieved by a method of forming depleted conductor regions on a substrate, comprising the steps of:

(a) providing a substrate containing well doping regions, isolation features and gate insulator;

(b) forming a doped conductor layer on the substrate;

(c) masking portions of the doped conductor layer; and (d) counter doping unmasked portions of the doped conductor layer for forming said depleted conductor regions.

BRIEF DESCRIPTION OF THE DRAWINGS

The above and other objects and features of the present invention will become apparent from the following description of preferred embodiments, in conjunction with the accompanying drawings, in which:

FIG. 1 illustrates a relationship between threshold voltage (Vth) and the lithographically designed channel length(Leff) for thin and thick oxide devices;

FIG. 2 shows output current characteristic of thin and thick oxide devices;

FIG. 3 is a schematic diagram illustrating a substrate, a part in which a doped conductor layer is formed on the substrate, a part in which portions of the doped conductor layer are masked, and a part in which unmasked portions of the doped conductor layer are counterdoped;

FIG. 4 shows that standard GC process follows implant;

FIG. 5 is a schematic diagram showing that WB mask is used to separate array and non-array GC; and FIG. 6 shows that standard GC process follows implant.

DETAILED DESCRIPTION OF THE PREFERRED EMBODIMENTS

Referring to FIG. 3 to FIG. 6 methods of forming depleted conductor regions on a substrate are disclosed. The method is initiated with the preparation of a substrate, followed by forming a conductor layer on the substrate, implanting a dopant species into the conductor layer, masking portions of the doped conductor layer and counterdoping unmasked portions of the doped conductor layer for forming said depleted conductor regions.

A preferred embodiment of the present invention is illustrated in detail in FIG. 3 showing a substrate, which comprises silicon well doping regions, isolation regions and gate insulator (not shown). It is apparent to a person skilled in the relevant art that other substrates may alternatively be used.

Further, FIG. 3 illustrates a state in which a doped conductor layer is formed on the substrate. The conductor layer can be formed by using a method of including blanket CVD deposition of conducting material, e.g., polysilicon over the gate oxide and isolation regions. The layer has a thickness of between 500–3000 Å.

Thereafter, the conductor layer is implanted with a dopant species. Alternatively, the conductor may be deposited as insitu doped. In accordance with a preferred embodiment of the present invention, implanting with a dopant species is carried out using a low-energy/high dose ion implantation of a suitable impurity type e.g., phosphorus, arsenic, boron and antimony. (An N++ conductor is assumed).

The method of forming depleted conductor region of the present invention further includes the step of masking portions of the doped conductor layer. FIG. 3 shows a part in which portions of the doped conductor layer are masked. The masking process comprises depositing and patterning a photoresistant layer. In a preferred embodiment of the present invention, the masking material masks portions of the doped conductor layer where low voltage devices are to be formed. The unmasked portions of the conductor layer are to be counterdoped and high voltage devices will be formed. In accordance with the present invention, the masking is performed by using such materials as photoresist or a hard mask. In a preferred embodiment of the present invention, the masking material is photoresist.

Thereafter, the unmasked structure is counterdoped to form conductor regions that deplete when appropriate voltage levels are applied, and subsequently not deplete with a second set of appropriate voltages applied on the substrate. FIG. 3 shows a part in which unmasked portions of the doped conductor layer are counterdoped. In a preferred embodiment of the present invention, the counterdoping process is carried out by ion implantation of a dopant which is of opposite polarity to the first dopant type. In accordance with the present invention, both types of devices formed by doped and counterdoped conductor layer are provided. In a preferred embodiment of the present invention, the doped regions function as low voltage devices, while the counterdoped portions do as high voltage devices. Specifically, the high voltage devices are used for word line devices or in any part of the memory architecture or logic requiring high voltage operation, while the low voltage devices are used for support devices. The word line devices in accordance with the present invention can be used preferably in the area of technologies utilizing memory arrays such as DRAM, EDRAM, SRAM and NVRAM.

Therefore, the present invention provides an alternative to dual gate oxide for higher voltage operation, wherein low voltage regions at doped layers are used for support devices, while high voltage regions at counterdoped areas are used for word line devices. The preferred embodiments of the present invention are further described in the following embodiments.

First Embodiment: Alternate Doping Compensation

All DRAM technologies which have an isolated body contain a mask which implants the isolation layer. In 256M technology this mask is called WB. It can be used to implant the array poly as shown in FIG. 3 with a compensating P+ dose to achieve the required gate depletion such that the equivalent array oxide thickness can withstand the boost voltage during operation. Following this implant, normal gate processing occurs. In this example, tungsten followed by a capping layer can be applied as shown in FIG. 4, and then the stack is etched as is typically practiced. Hardware is processed where control in the range of 0.5 nm to 2.0 nm increase in equivalent Tox is demonstrated, without adversely affecting the GC etch bias, and maintaining the sub-threshold characteristics of the thin oxide support device.

The compensating P+ implant into the array GC results in a net N+-type doping concentration which is lower than what is in the support gate (N++) conductor areas. When the wordline is positively boosted, depletion occurs in the gate conductor due to the wordline being positive with respect to the bitline and storage node diffusions. This results in an increase in the effective Tox and a reduction in electric field during boost. DIBL is enhanced by the increased effective gate oxide thickness, thus lowering the Vt in a pure dual oxide technology and producing the adverse effect of FIG. 1. However, in this invention, the off-condition of the gate of the array MOSFET is negative with respect to the diffusions and the gate conductor is in an electron accumulated condition. This accumulation condition makes the effective gate insulator thickness equal to the physical thickness of the gate insulator material, e.g., $SiO_2$ or nitride oxide, when the device is in the off state. Therefore, the MOSFET is held in a more secure off state by the thinner effective gate insulator thickness, which also improves resistance to DIBL. Physically following FIG. 1, the device follows the behavior of the third oxide curves under this appropriate off state voltage condition, while a true thick oxide device would not. Accordingly, the invention achieves a variable Vt effect, where the Vt is actually dynamically lowered when the high voltage array MOSFET is in the on-state. Conversely, when the device is in the on-state, it can withstand higher voltage, hence larger overdrive and a faster device, as compared to standard gate conductors, because of dynamically increased Tox.

Second Embodiment: Capped Polysilicon

The second embodiment of the invention is depicted in FIG. 5. All DRAM technologies that have an isolated body contain a mask which implants the isolation layer. In 256M technology this mask is called WB. This mask can also be used to partially block the N++ support implant in the array block, by placing an implant screening layer over the array block as shown in FIG. 5. Silicon nitride is used, but other layers are available. This allows a single implant to be used in creating the highly doped N++ support gate, and the N+ depleted memory gate. This simple modification achieves the required gate depletion such that the equivalent array oxide thickness can withstand the boost voltage during operation. This is quite convenient as the DRAM technology uses single work function, N-Type gate electrode. Following this implant, the screening layer is stripped from the array, and subsequent normal gate processing occurs. In this example, tungsten followed by a capping layer can be applied, as shown in FIG. 6, and then the stack is etched as is typically practiced.

The invention provides MOSFETS containing two devices with a capped gate conductor having all else equal except the gate conductor doping levels, wherein one dopant level is higher than the other. The lower doped electrode MOSFET has a dynamic threshold voltage associated with it such that:

When the device is off (gate potential moves towards 0.0 Volts for an NMOSFET), the threshold voltage decreases, but the device behaves like the higher gate electrode N++ doped NMOSFET, having very good (i.e.) low off current, thus low leakage, resulting in the dynamic reduction in Tox and improved short channel effect.

When the device is on (gate potential in this case is much higher than the power supply), the effective gate oxide thickness increases, and the device can tolerate the higher voltage which results in higher speed operation.

Although FIGS. 3 to 6 illustrate N++ and N+ gates for NMOS devices, the present invention is also applicable to P++ and P+ gates for PMOS devices. The present invention extends to the technologies where P++ and N++ gates are the standard practice, producing P++, P+, N++ and N+ devices to handle complementary high/low voltages. Further, the present embodiments of the invention extend to multiple processes, creating hybrid type devices including N++, N+, N, N−, N−−, P++, P+, P, P−, P−−,etc. The present embodiments are, therefore, to be considered in all respects as illustrative and not restrictive.

While the present invention has been described with respect to the particular embodiments, it will be apparent to those skilled in the art that various modifications and changes may be made without departing from the spirit and scope of the invention as defined in the following claims.

What is claimed is:

1. A method for forming depleted gate conductor regions on a substrate, said method comprising the steps of:
    (a) providing a substrate;
    (b) forming a doped conductor layer on the substrate;
    (c) masking portions of the doped conductor layer; and
    (d) counterdoping unmasked portions of the doped conductor layer for forming said depleted conductor regions.

2. The method according to claim 1, wherein the step (b) further comprises the steps of forming a conductor layer on the substrate and implanting a dopant species into the conductor layer.

3. The method according to claim 1, wherein masked portions form low voltage devices.

4. The method according to claim 1, wherein the depleted conductor regions form high voltage devices.

5. The method according to claim 1, wherein the substrate contains doping regions, isolation regions and a gate insulator.

6. The method according to claim 1, wherein the substrate comprises silicon.

7. The method according to claim 1, wherein the conductor layer comprises polysilicon.

8. The method according to claim 1, wherein the forming of the doped conductor layer comprises ion implantation including phosphorus, arsenic, boron and antimony.

9. The method according to claim 1, wherein a masking material comprises photoresist or hard mask material.

10. The method according to claim 1, wherein the step of masking is done using a method comprising depositing and patterning of photoresist or hard mask material.

11. The method according to claim 1, wherein the step of counterdoping is done using a method comprising ion implantation of a dopant which is of opposite polarity to a first dopant type.

12. The method according to claim 1, wherein the masked portions are used for support devices.

13. The method according to claim 1, wherein the depleted regions are used for mixed voltage semiconductors.

14. The method according to claim 1, wherein doped and depleted conductor regions are used as an alternative to dual gate oxide for metal oxide semiconductor field effect transistors (MOSFETS).

15. The method according to claim 1, further comprising the steps of applying tungsten and a capping layer, and etching a stack.

16. The method according to claim 15, further comprising the steps of forming memory and logic devices.

17. The method according to claim 16, wherein the memory devices are used for mixed voltage semiconductors.

18. A method of forming a capped gate electrode of a memory array having a voltage in excess of a designed Vdd voltage, comprising the steps of:
    (a) predoping the electrode with an alternate species to provide a depletion effect within the electrode; or
    (b) patterning an implant screening layer on high voltage devices to partially block a portion of a dose, thus providing a depletion effect within the electrode;
    (c) capping the electrode and patterning the electrode with the cap in place both high voltage and low voltage gate electrodes, thus providing a means of separating diffusion doping from gate doping; and
    (d) providing high voltage and low voltage devices such that the high voltage devices have low voltage properties in their off states.

19. The method according to claim 18, wherein the memory array is used for mixed voltage semiconductors.

20. Metal oxide semiconductor field effect transistors made in accordance with the method of any of claims 1 to 19.

21. A method for forming highly doped and lower doped conductor regions on a substrate,
    comprising the steps of:
    (a) providing a substrate;
    (b) forming a doped conductor layer on the substrate;
    (c) masking portions of the doped conductor layer; and
    (d) placing a screening layer over the doped conductor layer for forming said depleted conductor regions.

22. The method according to claim 21, wherein the step (b) further comprises the steps of forming a conductor layer on the substrate and implanting a dopant species into the conductor layer.

23. The method according to claim 21, wherein masked portions comprise nitride layer are patterned.

24. The method according to claim 21, wherein the lower doped conductor regions form high voltage devices.

25. The method according to claim 21, wherein the substrate contains doping regions, isolation regions and a gate insulator.

26. The method according to claim 21, wherein the substrate comprises silicon.

27. The method according to claim 21, wherein the conductor layer comprises polysilicon.

28. The method according to claim 21, wherein the forming of the doped conductor layer comprises ion implantation including phosphorus, arsenic, boron and antimony.

29. The method according to claim 21, wherein a masking material comprises photoresist or hard mask material.

30. The method according to claim 21, wherein the step of masking is done using a method comprising depositing and patterning of photoresist or hard mask material.

31. The method according to claim 21, wherein the step (d) is done using a method comprising ion implantation of a dopant which is of same polarity as first dopant type.

32. The method according to claim 21, wherein the method provides highly doped N++ support gate and N+ depleted high voltage gate.

33. The method according to claim 21, wherein the method provides highly doped P++ support gate and P+ depleted high voltage gate.

34. The method according to claim 21, wherein the lower doped regions are used for mixed voltage semiconductors.

35. The method according to claim 21, wherein the highly doped and lower doped conductor regions are used as an alternative to dual gate oxide for metal oxide semiconductor field effect transistors (MOSFETS).

36. The method according to claim 21, further comprising the steps of stripping the screening layer, applying tungsten and a capping layer, and etching a stack.

37. The method according to claim 36, further comprising the steps of forming memory and logic devices.

38. The method according to claim 37, wherein the memory devices comprise DRAM, EDRAM, SRAM or NVRAM.

* * * * *